United States Patent
Smart

[11] Patent Number: 5,234,354
[45] Date of Patent: Aug. 10, 1993

[54] METAL RETAINER ON CONNECTOR FOR HOLDING INSERTED PRINTED CIRCUIT BOARD

[75] Inventor: Leigh M. Smart, Los Angeles, Calif.

[73] Assignee: Altronics Connector Corporation, Los Angeles, Calif.

[21] Appl. No.: 889,453

[22] Filed: May 26, 1992

[51] Int. Cl.5 ............................................ H01R 13/62
[52] U.S. Cl. ...................................... 439/326; 439/328
[58] Field of Search ................................ 439/326–328, 439/296, 629–637

[56] References Cited

U.S. PATENT DOCUMENTS

| | | | |
|---|---|---|---|
| 4,712,848 | 12/1987 | Edgley | 439/327 |
| 5,004,429 | 4/1991 | Yagi et al. | 439/326 |
| 5,041,005 | 8/1991 | McHugh | 439/326 |
| 5,112,242 | 5/1992 | Choy et al. | 439/328 |

Primary Examiner—Larry I. Schwartz
Assistant Examiner—Hien D. Vu
Attorney, Agent, or Firm—Allan M. Shapiro

[57] ABSTRACT

Daughter boards having edge pads thereon are inserted into a single in-line memory module (SIMM) connector on the mother board and are tilted up to latched position to increase contact pressure and retain the daughter board in place. In the present connector, the retainer which retains the inserted printed circuit board in the raised position is a metal spring wrapped around an upright post and is replaceable.

18 Claims, 2 Drawing Sheets

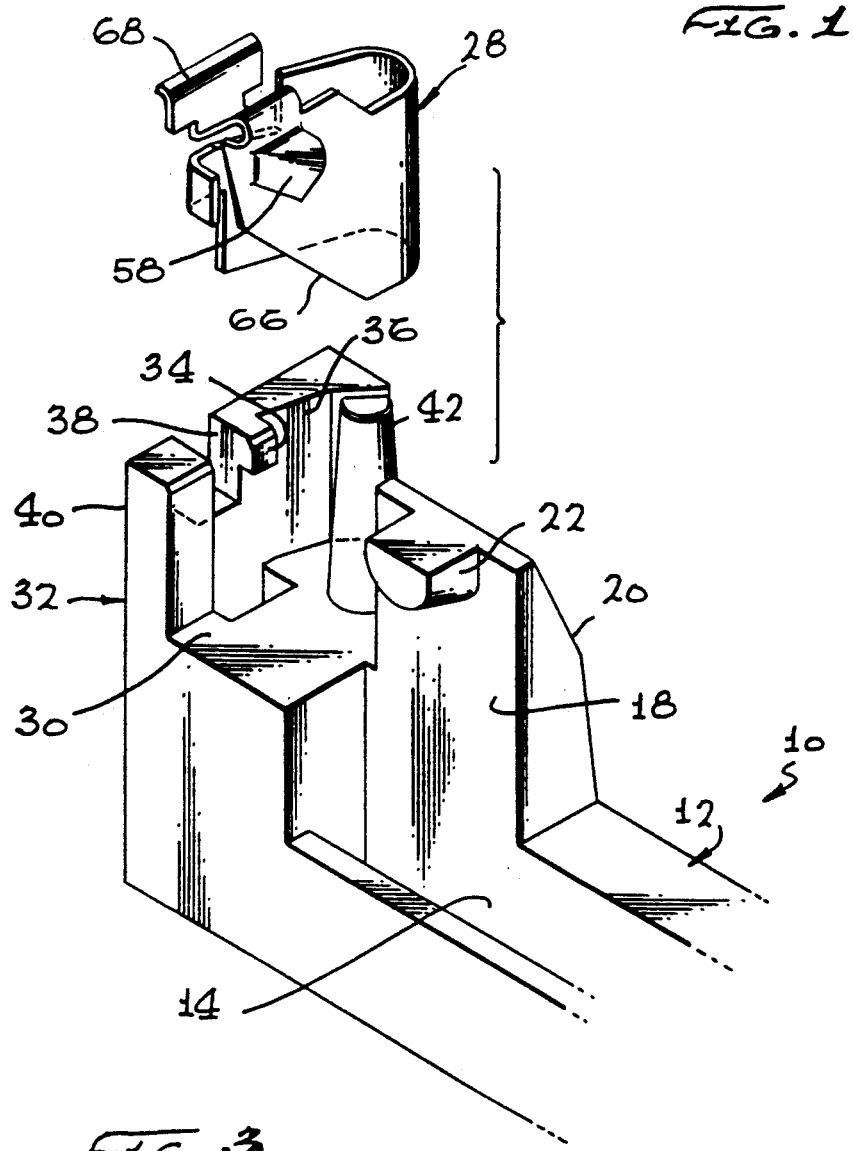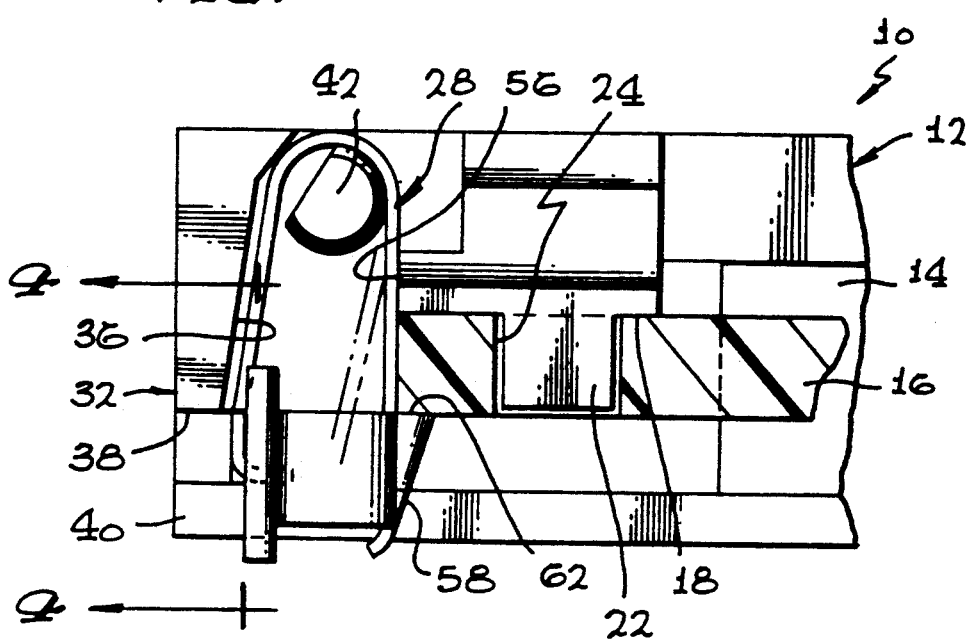

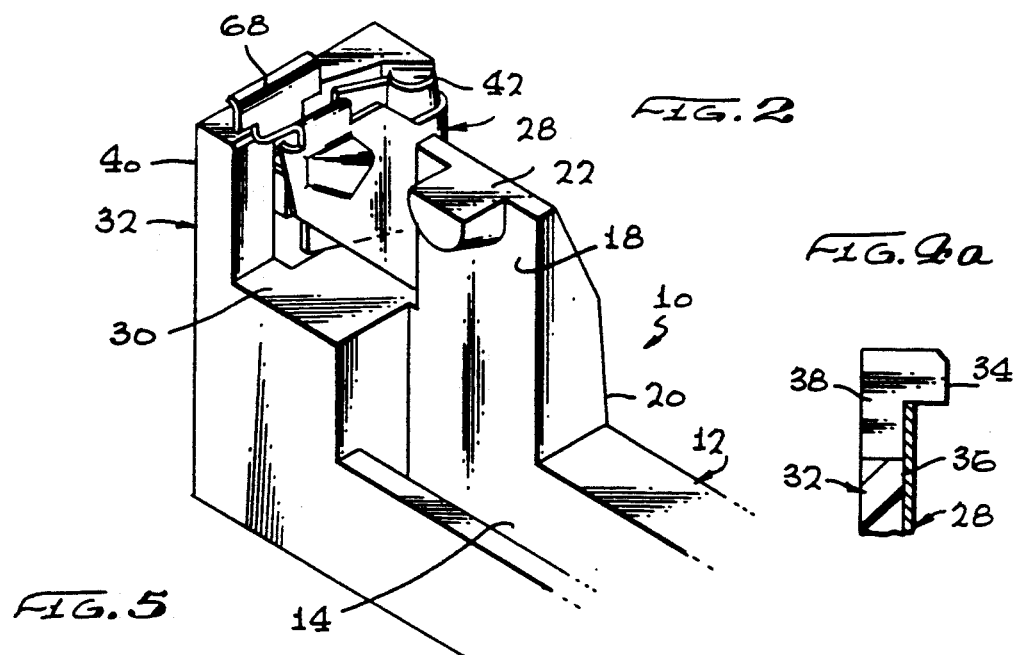
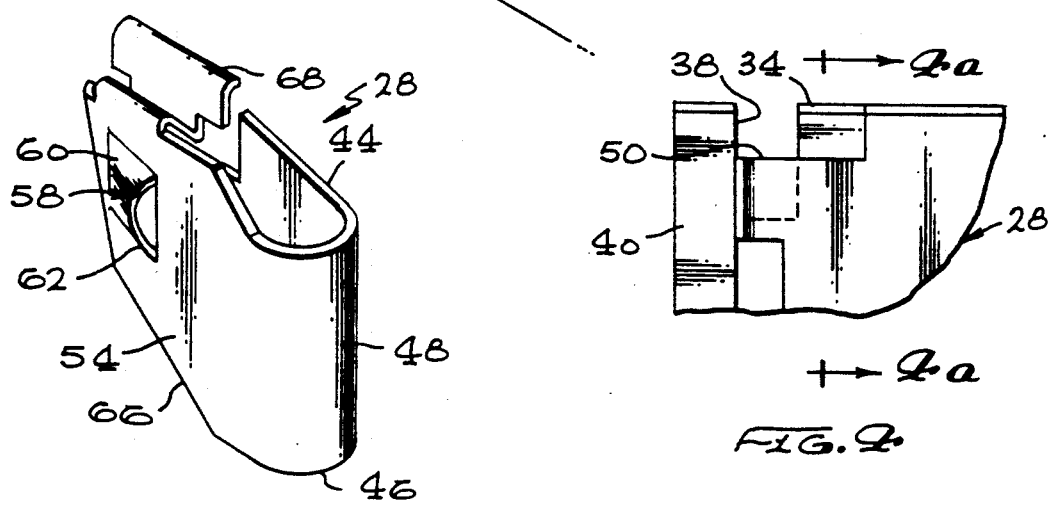
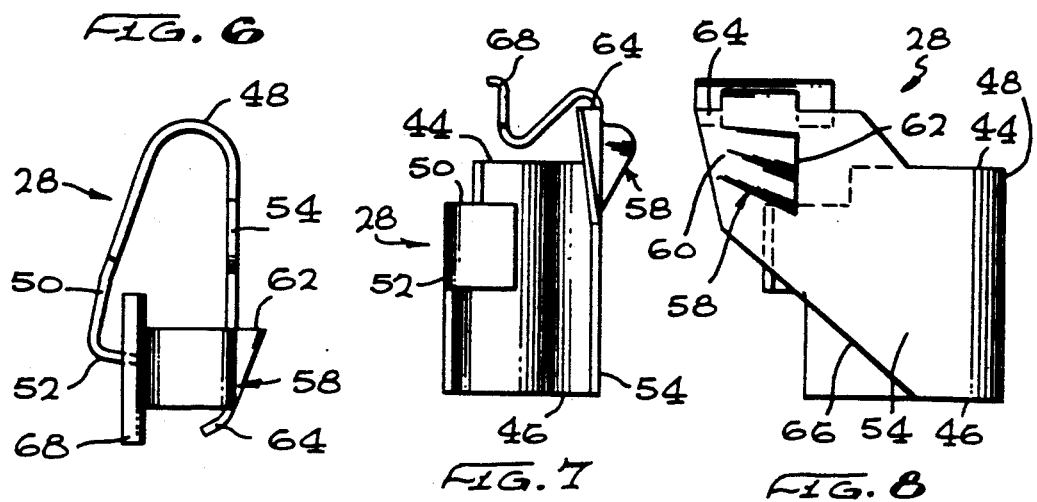

METAL RETAINER ON CONNECTOR FOR HOLDING INSERTED PRINTED CIRCUIT BOARD

FIELD OF THE INVENTION

This invention is directed to an improvement in single in-line memory module (SIMM) connectors wherein the retainer which holds the inserted printed circuit board in the contact position is a replaceable metal spring.

BACKGROUND OF THE INVENTION

In modern computers, daughter boards are connected into mother boards. The daughter boards carry various computer memory and other subcircuits and interact with the various devices, including other daughter boards, connected to the mother board. A standardized connection structure has been developed. In this standardized single in-line memory module connection structure, commonly called SIMM, the daughter board is provided with a series of contact pads along one edge thereof, preferably on both sides. There is a slot in the connector body to receive the edge of the printed circuit board having the connector pads thereon. The slot has contacts therein, and the contacts are spaced sufficiently far apart that, when the board is inserted at the correct angle, there is zero to little contact pressure. When fully inserted, the daughter printed circuit board is tilted up in the connector. This tiltup increases contact force to a desirable value. A locating hole in the daughter board receives a locating pin on the SIMM connector to vertically and laterally locate and lock the daughter board in the connector. A retainer on the connector engages the daughter board and holds the daughter boar in the engaged position.

In some previous SIMM connectors, the latch was molded as part of the body of the connector. When a service person attempted to remove a daughter board in a SIMM connector, it was first necessary to disengage the latch. When disengaged, the inserted printed circuit board could be lowered to its low contact pressure position and removed. However, in some cases, the service person failed to disengage the latch properly, and as a result, the latch was broken. Once the latch was broken, the connector was not reliable and the daughter board thus had to be taken out of service. The replacement of the connector was not a simple procedure because such connectors are soldered directly into the circuits on the printed circuit board The replacement of the connector on the mother board thus becomes a major maintenance project. This invention is directed to a replaceable metal retainer which retains the inserted circuit board in position. The retainer is replaceable if damaged without the need for replacement of the connector on the mother board.

SUMMARY OF THE INVENTION

In order to aid in the understanding of this invention, it can be stated in essentially summary form that it is directed to a replaceable metal retainer for releaseably retaining an inserted printed circuit board in a connector. The connector has a body having contacts therein into which a printed circuit board can be inserted. The replaceable metal retainer is removable and replaceable with respect to the connector body, should the metal retainer become damaged.

It is thus an object and advantage of this invention to provide a connector for the connection of a daughter board into a mother board with a replaceable metal retainer so that, when the original daughter board retainer becomes damaged, the metal retainer can be replaced without replacing the entire connector.

It is a further object and advantage of this invention to provide a SIMM connector which has a retainer post adjacent the daughter board slot with a metal retainer replaceably positioned on the post so that, should the metal retainer become damaged, it can be replaced with a new retainer on the post to replaceably retain the daughter board in place.

It is another object and advantage of this invention to provide a structure which permits renewal of the retainer in a SIMM connector without the need for removing the SIMM connector from the mother board.

It is a further object and advantage of this invention to provide a replaceable metal retainer on a SIMM connector where there is a ramp and a retaining face on the replaceable retainer with the ramp and the retaining face both being positioned a maximum distance away from the connector edge of the daughter board and from the upright retainer post on which the retainer is positioned.

The features of the present invention which are believed to be novel are set forth with particularity in the appended claims. The present invention, both as to its organization and manner of operation, together with further objects and advantages thereof, may be best understood by reference to the following description, taken in conjunction with the accompanying drawings.

BRIEF DESCRIPTION OF THE DRAWINGS

FIG. 1 is an exploded view of a connector in accordance with this invention, with part of the connector broken away and the metal retainer shown in exploded position.

FIG. 2 is a similar view, but showing the metal retainer mounted on its retainer post.

FIG. 3 is a enlarged plan view of the structure of FIG. 2.

FIG. 4 is a section taken generally along the line 4—4 of FIG. 3, with parts broken away.

FIG. 4a is a section taken generally along the line 4a—4a of FIG. 4.

FIG. 5 is an isometric view of the replaceable metal retainer.

FIG. 6 is a plan view thereof.

FIG. 7 is an end view thereof.

FIG. 8 is a face view thereof.

DESCRIPTION OF THE PREFERRED EMBODIMENT

Connector 10 has a body 12 for the insertion therein of a printed circuit board. The body has a slot 14 into which the edge of the printed circuit board is inserted. In the bottom of the slot are contacts of generally U-shaped configuration. The edge of the printed circuit board has pads thereon. The dimensions and configuration are such that, when inserted at the proper angle, the edge pads on the printed circuit board are inserted into the contacts with zero or minimum insertion force. After insertion, the printed circuit board is rotated about the inserted edge to an engaged position. The rotation causes an increase in contact force so that reliable contact is made. Printed circuit board 16 is seen in FIG. 3. As it is rotated about its contact edge from the insertion position to the engaged position, the printed circuit board 16 moves against stop surface 18 of stop post 20. The stop post carries a locating pin 22 thereon over which is engaged the locating hole 24 in the printed circuit board. When the printed circuit board 16 is retained against the stop post, the printed circuit board is accurately positioned and retained with respect to the connector body by means of the stop post on the locating pin. In this way, reliable positioning during insertion and reinsertion is accomplished.

It is to the retainer for retaining the printed circuit board in the retained position and the associated portion of the connector body to which this invention is particularly related.

Retainer 28 is seen in FIGS. 1, 2, 3, 4, 4a, 5, 6, 7 and 8. It is to be noted that the connector 10 is double-ended, and we only see the left end in FIGS. 1, 2 and 3. There is a symmetrically identical structure on the broken-away end of the connector body and a symmetrically identical retainer at that end. The retainer 28 is described, and it is understood that it is one of a pair to reliably retain the printed circuit board in position. The connector body 12 is provided with features which receive the retainer 28 and hold it in position. Floor 30 acts as a bottom support for the retainer. Wall 32 extends upward from the floor to provide a rotary stop for the retainer. Boss 34 extends inward from the inner face 36 of the wall. Window 38 provides an opening through the wall adjacent boss 34. End post 40 also extends inward from the inner face 36. In this respect, inward is toward the printed circuit board slot. Pivot post 42 extends upward from floor 30 between stop post 20 and wall 32.

Retainer 28 is configured to be removably inserted into the pocket thus formed around the pivot post 42. Retainer 28 is made of spring metal of uniform thickness so that it may be readily stamped, formed and bent. The retainer 28 is of generally U-shape and, in the central portion of its generally U-shaped body, it has a top edge 44 and a bottom edge 46. The bottom edge lies against floor 30 and the U-bend 48, and the retainer body embraces pivot post 42. The fixed end of the retainer has a stepdown top edge 50 which engages under boss 34, see FIG. 4a. Limit finger 52 is turned in at the fixed end of the spring to serve as an over-stress limit stop for the free, moving end of the retainer spring, as described hereinafter. With the step down top edge 50 engaged under the boss 34, the retainer 28 cannot rise off of its pivot post 42. However, window 38 permits the fixed end of the retainer spring to be bent inward away from the boss 34 so that the old retainer 28 can be lifted off of pivot post 42 for replacement of the retainer.

The wall 54 of the free end of the retainer spring normally lies against the outer face 56 of stop post 20, as seen in FIG. 3. The retainer 28 is configured so that, when in position and engaged against the inner face 36 and against the outer wall 56 of the retainer post 20 (seen in FIG. 3), the free end of the retainer, and particularly wall 54, lies substantially at a right angle with respect to the general plane of the printed circuit board 16.

Retainer projection 58 extends outward from wall 54. The retainer projection is formed by malleable distortion of the wall 54 to present a ramp 60 and a retaining face 62. The retaining face is formed substantially at a right angle with respect to wall 54, see FIG. 6. The retainer projection is positioned a sufficient distance away from stop surface 18 that the printed circuit board 16 can be accepted behind the retaining face 62, see FIG. 3. With the U-shaped spring body of the retainer urged in the open direction toward the full-line position of FIG. 3, the printed circuit board is securely held in place.

When the printed circuit board is inserted into the slot 14 and is swung up into position against the stop post 20, the printed circuit board first engages the angular tail 64, which thrusts the free arm of the spring carrying retainer projection 58 toward the spring-compressed position. Thereupon, the edge of the printed circuit board engages against the ramp 60, which thrusts the free end of the retainer toward the dashed-line position in FIG. 3. In this position, the printed circuit board can pass the retainer projection. Once the ramp 58 and face 62 are past the edge of printed circuit board 16, the retainer spring is released and moves to the retaining position shown in FIG. 3.

It is important to note that the retainer projection 58 is asymmetrical in its face, see FIGS. 5 and 7, and is asymmetrical on the ramp, see FIGS. 7 and 8. By placing the front of the farthest extending portions of the retainer projection 58 at a maximum distance from the floor 30 and bottom 46, these maximum projections are farthest away from the bottom edge of the printed circuit board around which the printed circuit board rotates from its insertion position to its engaged and locked position against the post 20. Maximizing the lever arm minimizes the stresses on the printed circuit board as it is installed. In addition, cutback edge 66, see FIGS. 1 and 8, is a diagonal edge which extends upward from the bottom edge 46 adjacent U-bend 48 upward to the angular tail 64. The reduction in area of the free arm of the U-shaped retainer and the fact that the cutback edge is away from the retainer projection 58 permits the free wall 54 to twist when stressed, with the retainer projection 58 moving away from the engagement position without requiring the entire wall 54 to deflect at the U-bend. This permits easier deflection of the retainer projection out of the way of the printed circuit board for installation and removal of the printed circuit board.

In order to release the printed circuit board, finger tab 68 is formed integrally with the remainder of the retainer 28 and extends upward from the wall 54 directly above the retainer projection 58. The finger tab 68 extends back of the wall 54 so that a finger engaging on the finger tab 68 is away from the edge of the printed circuit board. By manual engagement of the finger on the finger tab, the retainer projection 58 is released from the printed circuit board, as seen in dashed lines in FIG. 3, so that the printed circuit board can be rotated forward and removed. The bending of the retainer is substantially around the pivot post 42, except for the twist of the wall 54 during stress of the wall by forces against the finger tab or the retainer projection. When it is required that the retainer 28 be replaced, a tool can be inserted into window 38 to release top edge 50 from below boss 34 to permit raising of the entire retainer out of its pocket. A new retainer can be replaced into the pocket by engaging the top edge 50 beneath the boss 34. In this way, the retainer can be reused and replaced as necessary.

This invention has been described in its presently contemplated best modes, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A replaceable retainer for releaseably holding a printed circuit board in a connector, comprising:

a U-shaped body, said U-shaped body having a fixed end and a free end, said U-shaped body between said fixed end and said free end being substantially in the form of a hemi-cylindrical curve about an axis, an upper axial end and a lower axial end with respect to said axis of said U-shaped body, said free end of said body having a retainer projection thereon, said retainer projection having a retaining face which lies in a plane substantially parallel to said axis, said retainer projection being closer to said upper axial end than to said lower axial end and being asymmetrical about a plane at right angles to said face plane and at right angles to said axis, said free end of said body being cut away from adjacent said cylindrically curved portion of said body to adjacent said retainer projection to permit twisting of said free end about an axis normal to said axis of cylindrical curvature.

2. The replaceable retainer of claim 1 wherein said retainer is made of spring metal of substantially uniform thickness and said retainer projection is formed out of said free end of said retainer.

3. The replaceable retainer of claim 2 wherein a finger tab is formed on said free end of said retainer and is integrally formed with said replaceable retainer.

4. The replaceable retainer of claim 3 wherein said fixed end of said body has a limit finger extending toward said free end of said body to limit motion of said free end of said body toward said fixed end of said body.

5. The replaceable retainer of claim 4 wherein said asymmetrical retainer projection is asymmetrical to project farther from said free end at a greater distance from said bottom edge of said replaceable retainer.

6. The replaceable retainer of claim 1 wherein said asymmetrical retainer projection is asymmetrical to project farther from said free end at a greater distance from said bottom edge of said replaceable retainer.

7. A connector comprising:

a body, a slot in said body for receiving the edge of a printed circuit board, a stop post on said body against which the printed circuit board can lie while in connector position, a stop wall on said body, a pivot post on said body separate from and between said stop post and said stop wall, said pivot post defining an axis for receiving therearound a replaceable retainer for retaining an inserted printed circuit board substantially against said stop post, said stop wall on said connector body standing adjacent said stop post;

a retainer having a body, said body having a curved portion which is curved around said axis and which is sized to embrace said pivot post, said retainer having a fixed end and a free end, said fixed end of said retainer lying against said stop wall and said free end of said retainer being positioned adjacent said slot and adjacent said stop post, said retainer being made of resilient material so that said free end can flex toward said fixed end; and a retainer projection on said free end of said retainer, said retainer projection having a retainer face positioned to face said stop post when said retainer is on said pivot post.

8. The connector of claim 7 wherein said wall has a boss thereon and said fixed end of said retainer engages beneath said boss so that said retainer cannot slide off of said pivot post without deflection of said free end away from said boss.

9. The connector of claim 8 wherein said retainer is made of flat metallic spring stock formed into retainer configuration.

10. The connector of claim 9 wherein said retainer projection is asymmetric about a plane perpendicular to said axis with its greatest projection away from said free end of said retainer in a position at a greater distance form said slot in said body.

11. The connector of claim 10 wherein said retainer projection is formed on said free end by forming it from said free end to create a retaining face thereon facing said stop post and create a ramp thereon facing away from said stop post so that a printed circuit board can be tilted up in said slot in said body and engage said ramp to force said free end in deflected direction until the printed circuit board clears the retainer projection and is close to said stop post.

12. The connector of claim 11 wherein both said ramp and said projection are asymmetrically positioned to be at a greater distance from said connector slot than if they were symmetrical.

13. The connector of claim 12 further including a finger tab formed on said free end of said retainer and integrally formed therewith so that said retainer can be deflected to disengage from a printed circuit board engaged by said retainer projection.

14. A connector comprising:

a connector body, a slot in said connector body for receiving the edge of an inserted printed circuit board, a stop post on said body substantially at a right angle to said slot for stopping rotation of the printed circuit board with its edge in said slot in a connected position, a pivot post on said body substantially parallel to and adjacent said stop post and a stop wall on said body separate from and adjacent said pivot post for engagement by a retainer to restrain rotation of a portion of the retainer about the stop post;

a retainer on said pivot post, said retainer being formed of spring metal of substantially constant thickness, said retainer having a fixed end and free end and a U-bend therein therebetween, said U-bend being sized to curve around said pivot post, means on said fixed end for engaging with said stop wall on said connector body to inhibit rotation of said fixed end of said connector body around said pivot post;

a face on said free end of said retainer, said face having a retainer projection extending therefrom, said retainer projection having a retainer face thereon, said retainer face being spaced from said stop post substantially equal to the thickness of the printed circuit board so that said retainer face engages a printed circuit board to hold the printed circuit board adjacent said stop post.

15. The connector of claim 14 wherein said retainer projection has a ramp thereon leading to said retainer face so that a printed circuit board engages on said ramp to thrust back said free end of said retainer until the printed circuit board clears said retaining face whereupon said free end resiliently springs forward to engage said retainer projection on the printed circuit board to retain the printed circuit board substantially against said stop post.

16. The connector of claim 15 wherein said retaining face is substantially planar and said ramp and said retaining face have greater projection away from said connector body than closer to said connector body slot.

17. The connector of claim 16 wherein said retainer has a cutback edge from adjacent its U-bend to adjacent its retainer projection to permit twisting of said free end so that said retainer projection can deflect past the edge of a printed circuit board with twisting of said free end of said retainer.

18. The connector of claim 17 wherein said free end of said retainer lies against said stop post when in the undeflected position to position said ramp on said retainer to be engaged by a printed circuit board as it is rotated in said connector slot against said stop post.

* * * * *